United States Patent
Hillman et al.

(10) Patent No.: US 7,521,089 B2
(45) Date of Patent: Apr. 21, 2009

(54) METHOD AND APPARATUS FOR CONTROLLING THE MOVEMENT OF CVD REACTION BYPRODUCT GASES TO ADJACENT PROCESS CHAMBERS

(75) Inventors: Joseph T. Hillman, Scottsdale, AZ (US); John G. North, Tempe, AZ (US); Steven P. Caliendo, Ashby, MA (US); John J. Hautala, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 155 days.

(21) Appl. No.: 10/171,185

(22) Filed: Jun. 13, 2002

(65) Prior Publication Data
US 2003/0230322 A1 Dec. 18, 2003

(51) Int. Cl.
C23C 16/00 (2006.01)
C23C 14/00 (2006.01)
H01L 21/306 (2006.01)
B65H 1/00 (2006.01)

(52) U.S. Cl. .............. 427/255.5; 427/248.1; 118/719; 414/805; 414/806; 414/935; 414/939; 204/192.1; 204/298.25

(58) Field of Classification Search .............. 438/492, 438/493, 680; 156/345.31, 345.32; 118/719; 414/939
See application file for complete search history.

(56) References Cited

U.S. PATENT DOCUMENTS

| | | | |
|---|---|---|---|
| 5,913,978 A * | 6/1999 | Kato et al. ........... | 118/719 |
| 6,016,611 A | 1/2000 | White et al. ........... | 34/92 |
| 6,328,864 B1 * | 12/2001 | Ishizawa et al. ........ | 204/298.01 |
| 6,572,924 B1 * | 6/2003 | Halpin .................. | 427/255.28 |
| 6,908,838 B2 * | 6/2005 | Strzyzewski ............ | 438/584 |
| 2001/0039921 A1 * | 11/2001 | Rolfson et al. .......... | 118/715 |
| 2003/0219977 A1 * | 11/2003 | Pomarede et al. ......... | 438/680 |

FOREIGN PATENT DOCUMENTS

| | | | |
|---|---|---|---|
| DE | 10159702 A1 * | 7/2002 | |
| JP | 07-211761 | 8/1995 | |
| JP | 10-270527 | 10/1998 | |
| JP | 10303279 A * | 11/1998 | |
| WO | WO 02052617 A1 * | 7/2002 | |

* cited by examiner

*Primary Examiner*—Karla Moore
(74) *Attorney, Agent, or Firm*—Wood, Herron & Evans LLP

(57) ABSTRACT

Method and apparatus for controlling the migration of reaction by-product gases from a chemical vapor deposition (CVD) process chamber to a transfer vacuum chamber shared by other process chambers. Separate regulated flows of purge gas are provided to the CVD process chamber and the transfer vacuum chamber before establishing a pathway for substrate transfer. A pressure differential is created between the transfer vacuum chamber and the CVD process chamber that reduces or prevents the migration of CVD reaction by-product gases arising from the establishment of the substrate transfer pathway. While the pathway is established, a directional flow of purge gas is maintained from the transfer vacuum chamber into the CVD process chamber.

10 Claims, 6 Drawing Sheets

METHOD AND APPARATUS FOR CONTROLLING THE MOVEMENT OF CVD REACTION BYPRODUCT GASES TO ADJACENT PROCESS CHAMBERS

FIELD OF THE INVENTION

The present invention generally relates to semiconductor wafer processing and, more particularly, to a gas purge control system and method for reducing or eliminating the migration of CVD reaction byproduct gases from a CVD process chamber to adjacent non-CVD process chambers during semiconductor wafer exchanges.

BACKGROUND OF THE INVENTION

Cluster tools are highly integrated multiple-chamber semiconductor wafer processing systems adapted to perform a sequence of individual processing steps in the fabrication of device structures on substrates, such as semiconductor wafers. Cluster tools have various advantages over stand-alone tools. For example, cluster tools increase product yield and process throughput, reduce contamination, and require less human intervention. In particular, multiple processing steps can be accomplished in the cluster tool without exposing the substrates to surrounding ambient atmosphere between consecutive processing steps.

Cluster tools typically include multiple process modules each adapted to perform a process step and a material handling system or wafer handler. Traditionally, cluster tools comprise either multiple physical vapor deposition (PVD) modules arranged around a central wafer handler or multiple chemical vapor deposition (CVD) modules arranged around a central wafer handler. The central wafer handler includes a wafer transfer robot operable to transfer wafers to and from wafer cassettes and among the various process modules in a series of pick-and-place operations. In a common arrangement, the wafer handler and a group of wafers to be processed are housed within a transfer vacuum chamber maintained at a given vacuum pressure. Except during wafer exchanges, the process chamber of each process module is isolated from the transfer vacuum chamber by a gate or slot valve. An opening provided in each slot valve is dimensioned to pass the wafer and an end effector of the wafer transfer robot carrying the wafer.

The integration of multiple process chambers into a single platform increases the process throughput of the cluster tool. However, the arrival of copper metallization in device fabrication has introduced previously unrecognized concerns in the design of cluster tools. To optimize the throughput, copper interconnect technologies require the integration of CVD process modules and non-CVD process modules, such as PVD process modules, into a single cluster tool for the production of various metallization layers. For example, copper interconnect technologies that rely on the Damascene and the dual Damascene processes typically include the sequential process steps of a soft-etch cleaning, CVD of a barrier layer, for example Ta/TaN, and PVD of a copper seed layer. The bundling of CVD and non-CVD process modules, such as PVD process modules, into a single cluster tool improves system performance by reducing the total time needed to process groups of wafers, which increases the tool capacity.

The central wafer handler of such bundled cluster tools must service both CVD and non-CVD process modules. One problem that arises in such bundled systems is the migration of the gaseous reaction byproducts of the CVD process, including non-reacted surplus source gases, from the CVD process chamber into the transfer vacuum chamber, housing the central wafer handler, during wafer exchanges. When the slot valve isolating the CVD process chamber is opened to permit a wafer exchange, CVD reaction byproduct gases migrate or diffuse through the opening and escape into the transfer vacuum chamber. The CVD reaction byproduct gases persist as a contaminant in the transfer vacuum chamber. When the slot valve for one of the non-CVD process modules is opened for a wafer exchange, the CVD reaction byproduct gases in the transfer vacuum chamber can enter the non-CVD process chamber. In particular, CVD reaction byproduct gases can contaminate PVD process chambers and be unintentionally incorporated into the thin films being deposited by the PVD process chamber. The incorporation of the CVD reaction byproduct gases as an impurity can degrade the mechanical and electrical properties of the thin film. In particular, the CVD reaction byproduct gases from the CVD process that deposits the Ta/TaN barrier layer are particularly detrimental to the subsequent PVD process that deposits the copper seed layer.

Various solutions have been proposed for reducing or eliminating the migration of CVD reaction byproduct gases out of the CVD process chamber during wafer exchanges. One proposed solution is to evacuate the CVD process chamber to a base vacuum level before conducting a wafer exchange. However, significant amounts of residual CVD reaction byproduct gases remain in the chamber and can escape through the slot valve into the transfer vacuum chamber during wafer exchanges. Another proposed solution is to provide a flow of a purge gas into the transfer vacuum chamber before the wafer exchange to raise the vacuum pressure of the transfer vacuum chamber to a significantly higher value than the vacuum pressure in the CVD process chamber. When the slot valve for the CVD process chamber is opened, however, a burst of purge gas occurs into the CVD process chamber. The rapid flow of purge gas provides an unstable, quasi-turbulent condition that urges CVD reaction byproduct gases to exit into the transfer vacuum chamber.

With growing requirements for integrating CVD process modules and non-CVD process modules into a single cluster tool platform, the present invention provides apparatus and methods for significantly reducing or eliminating the migration of CVD reaction byproduct gases from the CVD process module into the transfer vacuum chamber during wafer exchanges so that non-CVD process modules, that share the transfer vacuum chamber with the CVD process module, will not be contaminated by the CVD reaction byproduct gases.

SUMMARY OF THE INVENTION

The present invention provides apparatus and methods that reduce, inhibit or eliminate the migration of reaction byproduct gases from a chemical vapor deposition (CVD) process module into a common transfer vacuum chamber of a cluster tool when a gate or slot valve between the chambers is opened to accomplish, for example, a wafer exchange. The reduction, inhibition or elimination of the migration of CVD reaction byproduct gases prevents contamination of non-CVD process chambers, such as a physical vapor deposition (PVD) process chamber, that share the same transfer vacuum chamber.

By virtue of the foregoing, there is provided a semiconductor processing system comprising a CVD process chamber, a transfer vacuum chamber, and a gate valve interconnecting a first access port of the CVD process chamber with a second access port of the transfer vacuum chamber. The transfer vacuum chamber is coupled in selective fluid communication with a first vacuum pump for evacuating the CVD process chamber. The CVD process chamber includes a first gas inlet port and a first mass flow controller regulating a flow of purge gas from a gas source to the first gas inlet. The transfer vacuum chamber is coupled in selective fluid communication with a second vacuum pump for evacuating the transfer vacuum chamber. The transfer vacuum chamber includes a second gas inlet port and a second mass flow controller regulating a flow of purge gas from a gas source to the second gas inlet. The gate valve has a closed condition that isolates the first and second access ports and an open condition that places the first access port of the CVD process chamber in fluid communication with the second access port of the transfer vacuum chamber.

By virtue of the foregoing, there is also provided a method of transferring a substrate between a transfer vacuum chamber and a chemical vapor deposition (CVD) process chamber contaminated with CVD reaction by-product gases. The method includes providing purge gas to the CVD process chamber sufficient to establish a first vacuum pressure and providing purge gas to the transfer vacuum chamber sufficient to establish a second vacuum pressure, wherein the second vacuum pressure is greater than the first vacuum pressure. Then, a pathway is established between the CVD process chamber and the wafer transfer chamber for the transfer of the substrate so that purge gas flows from the transfer vacuum chamber to the CVD process chamber. The pressure differential between the first and the second vacuum pressures, when the pathway is established, is sufficiently low to reduce the migration of reaction by-product gases from the CVD process chamber to the transfer vacuum chamber induced by the establishment of the pathway.

By virtue of the foregoing, there is also provided a method of controlling the migration of reaction by-product gases from a chemical vapor deposition (CVD) process chamber to a transfer vacuum chamber through a gate valve interconnecting the chambers, in which the CVD process chamber is selectively evacuated by a first vacuum pump and the transfer vacuum chamber is selectively evacuated by a second vacuum pump. A first flow of purge gas into the CVD process chamber to establish a first vacuum pressure and a second flow of purge gas is introduced into the transfer vacuum chamber to establish a second vacuum pressure. The first flow of purge gas is discontinued so that the vacuum pressure in the CVD process chamber falls to a third vacuum pressure. The second vacuum pump is isolated from the transfer vacuum chamber so that the vacuum pressure in the transfer vacuum chamber rises to a fourth vacuum pressure, in which the fourth vacuum pressure is greater than the third vacuum pressure. The gate valve is then opened to couple the transfer vacuum chamber and the CVD process chamber in fluid communication and, due to the pressure differential, the second flow of purge gas is directed into the CVD process chamber. However, the pressure differential between the third vacuum pressure and the fourth vacuum pressure is sufficiently low to reduce the migration of reaction by-product gases from the CVD process chamber to the transfer vacuum chamber induced by the opening of the gate valve. After opening the gate valve, the second flow of purge gas may be maintained at a predetermined flow rate in a direction through the open gate valve from the transfer vacuum chamber into the CVD process chamber. The second flow of purge gas is evacuated from the CVD process chamber along with the first flow of purge gas and the reaction byproduct gases by the first vacuum pump so that the migration of reaction byproduct gases through the open gate valve into the transfer vacuum chamber is inhibited when the gate valve is open.

The present invention significantly reduces, inhibits or eliminates the migration of CVD reaction byproduct gases from a CVD process chamber to a transfer vacuum chamber during a substrate or wafer exchange. The control sequence for establishing the purge flow minimizes the pressure differential between the CVD process chamber and the transfer vacuum chamber, which prevents quasi-turbulence originating from the opening of the slot valve from inducing migration of the CVD reaction byproduct gases into the transfer vacuum chamber as the slot valve is opened. When the slot valve is in an open condition, the continuous flow of purge gas from the transfer vacuum chamber into the CVD process chamber significantly reduces, inhibits or eliminates the migration of CVD reaction byproduct gases from the CVD process chamber into the transfer vacuum chamber.

The present invention provides apparatus and methods for a CVD process module and a transfer vacuum chamber of a semiconductor processing system that isolate the vacuum environment of the CVD process module from one or more non-CVD process modules that share the same transfer vacuum chamber. The present invention eliminates the need to transfer wafers in the ambient cleanroom environment from a CVD process chamber to a separate PVD process chamber. By eliminating such wafer transfers, the process throughput is enhanced and productivity is significantly increased.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

The present invention provides apparatus and methods for reducing, inhibiting or eliminating the migration of reaction byproduct gases, during wafer exchanges, from a chemical vapor deposition (CVD) process module into a transfer vacuum chamber shared by multiple process modules of a cluster tool, including the CVD process module and at least one non-CVD process module. According to the principles of the present invention, the migration of CVD reaction product gases is controlled by providing a directional flow of a purge gas from the transfer vacuum chamber into the CVD process chamber during a wafer exchange. Before the pathway for the wafer exchange is established, purge gas is introduced into each chamber in an amount effective to minimize the pressure differential yet still provide the directional flow. In particular, the transient migration of the CVD reaction byproduct gases into the transfer vacuum chamber arising from the establishment of the pathway is inhibited, reduced or prevented by minimizing the pressure differential.

The method and apparatus of the present invention effectively reduce, inhibit or eliminate the migration of CVD reaction byproduct gases from a CVD process chamber to a transfer vacuum chamber during a wafer exchange therebetween. The control sequence for establishing the directional purge flow between the CVD process chamber and the transfer vacuum chamber, which prevents quasi-turbulence from inducing migration of the CVD reaction byproduct gases into the transfer vacuum chamber as the slot valve is opened. While the slot valve is maintained in the open condition, the continuous flow of purge gas from the transfer vacuum chamber into the CVD process chamber significantly reduces, inhibits or eliminates the migration of CVD reaction byproduct gases from the CVD process chamber into the transfer vacuum chamber.

Figure 1:
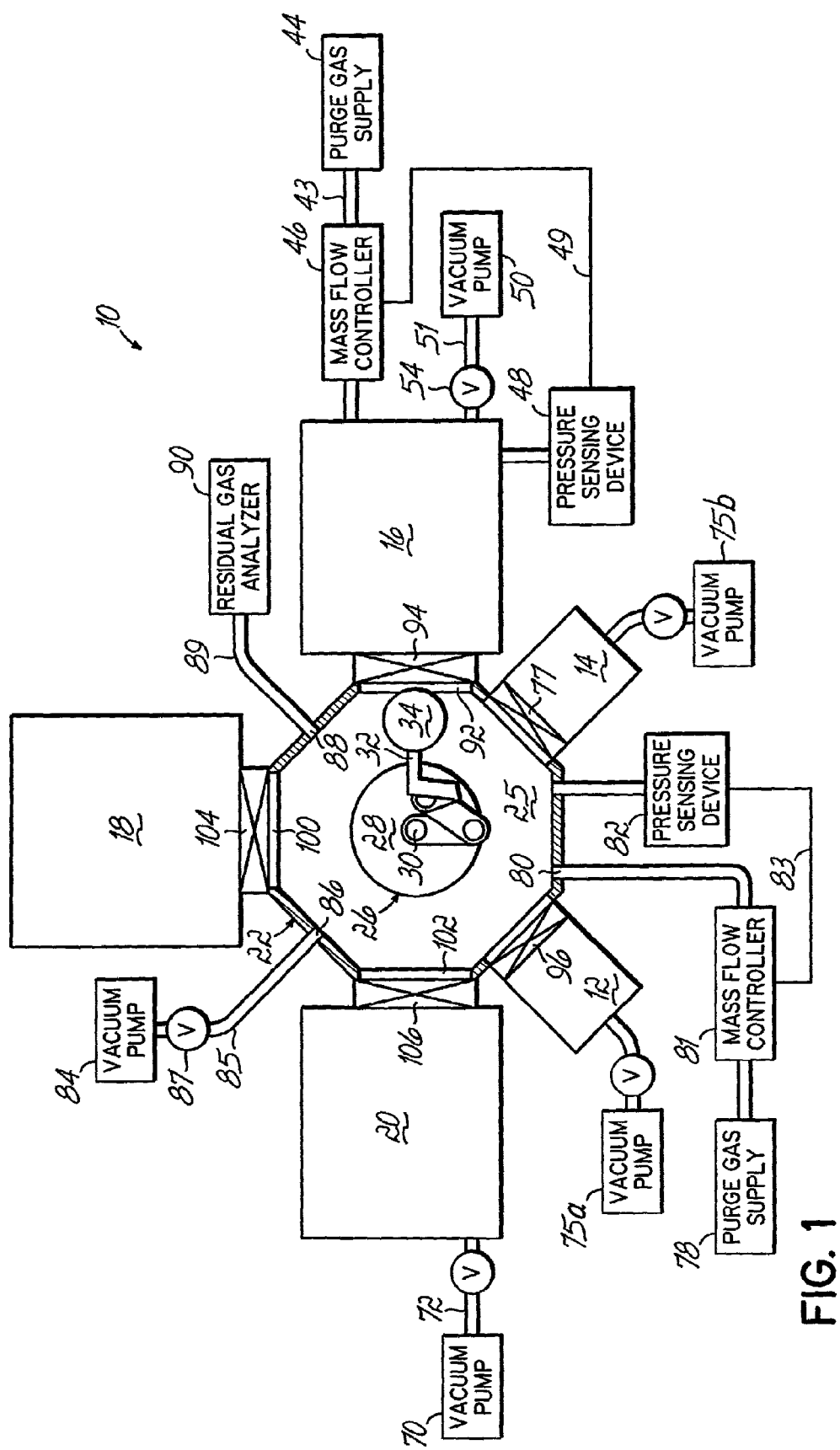
FIG. 1 is a schematic representation of a semiconductor processing system according to principles of the present invention.

With reference to FIG. 1, a multiple-chamber semiconductor processing system or cluster tool 10 is illustrated for practicing the methods of the present invention. The cluster tool 10 includes a pair of loadlocks 12 and 14, a plurality of, for example, three semiconductor process modules 16, 18 and 20, and a transfer vacuum chamber 22. The loadlocks 12 and 14 and the process modules 16, 18 and 20 are arranged about the periphery of the transfer vacuum chamber 22. At least one of the process modules, for example, process module 16 is a CVD process module and at least another of the process modules, for example, process module 20 is a non-CVD process module, such as a physical vapor deposition (PVD) process module. The remaining process module 18 may be selected from a CVD process chamber, a PVD process chamber, a surface pre-clean chamber, an orientation/degassing chamber, a bake buffer chamber, a cooldown chamber, or the like.

Figure 2:
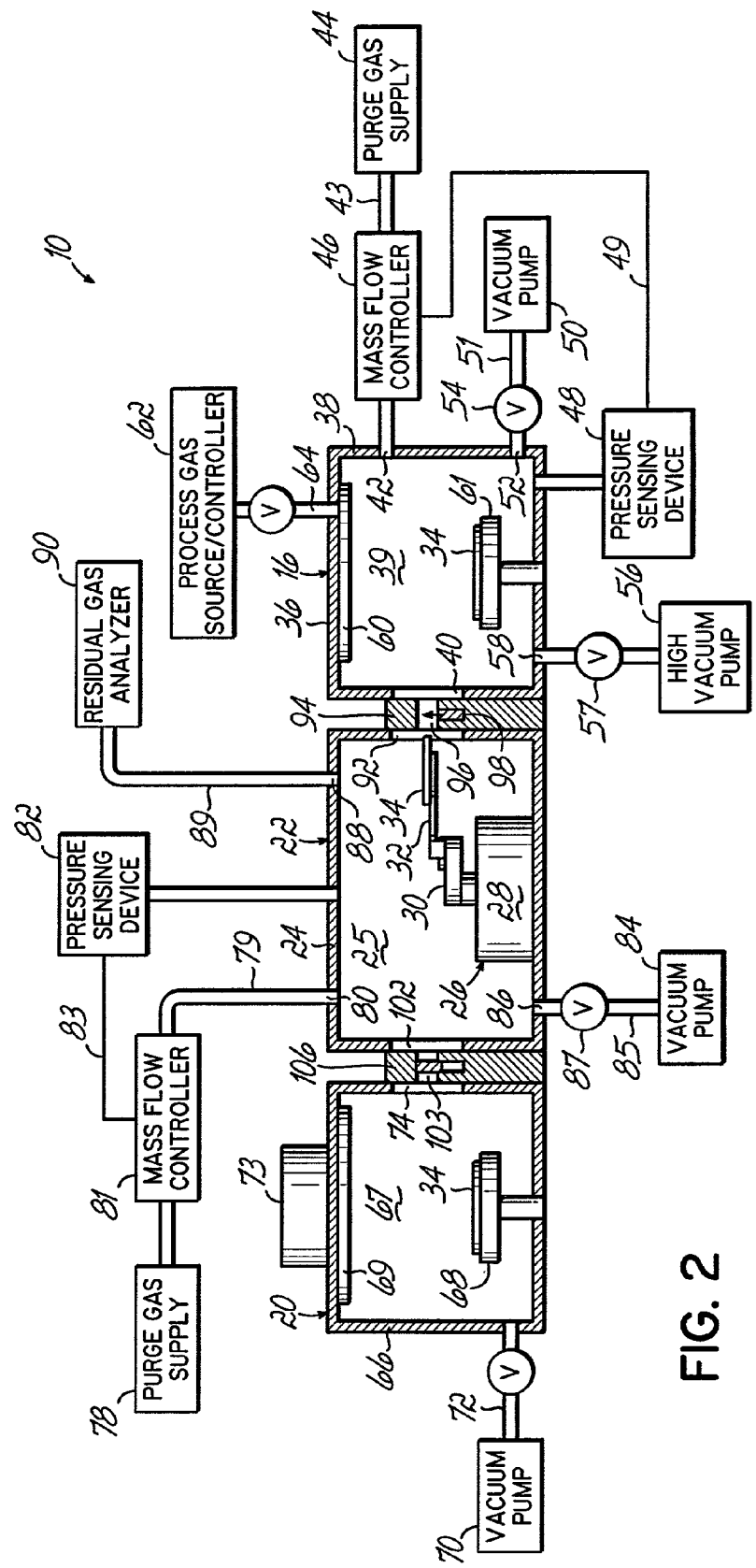
FIG. 2 is a schematic sectional view of the processing system of FIG. 1.

With reference to FIGS. 1 and 2, the transfer vacuum chamber 22 includes a chamber wall 24 that surrounds and encloses a vacuum environment 25. Positioned in the vacuum environment 25 of the transfer vacuum chamber 22 is a wafer handler 26 that includes a wafer handling robot 28 with a wafer transfer arm 30 and an end effector 32. The wafer handling robot 28 is operable to perform pick-and-place operations to serially transfer a plurality of substrates, such as semiconductor wafers 34, between the process modules 16, 18, 20 and to insert and remove wafers 34 from positions in holders, such as wafer cassettes (not shown), located in the loadlocks 12, 14. The wafer handler 26 is centrally located relative to the process modules to limit the move distance required for reaching wafers 34 held by the wafer cassettes and wafer supports located in processing positions within the process modules 16, 18, 20.

With continued reference to FIGS. 1 and 2, the CVD process module 16 may be any type of CVD process module including, but not limited to, hot wall reactors, cold wall reactors, plasma enhanced reactors, and rotating susceptor reactors, with or without premixing of the reactant gases, that a person of ordinary skill in the art would select for the CVD of layers, thin films, or thick films on substrates such as semiconductors wafers. The CVD process module 16 illustrated in FIGS. 1 and 2 includes a CVD process chamber 36 having a chamber wall 38 that surrounds a vacuum environment 39 and an access port 40 extending through a sidewall portion of the chamber wall 38. The CVD process chamber 36 includes a gas inlet 42 connected in fluid communication via a purge gas line 43 with a purge gas supply 44 of a purge gas. The purge gas supplied by the purge gas supply 44 may be an inert gas, such as argon, or a more reactive gas, such as nitrogen, depending upon the reactivity of the material deposited onto wafer 34 by the CVD process which transpires in the CVD process chamber 36. Installed in the purge gas line 43 between the purge gas supply 44 and the gas inlet 42 is a mass flow controller 46 that is operable to regulate the flow rate of the purge gas from the purge gas supply 44 to the gas inlet 42 with either open-loop or closed loop control. The CVD process chamber 36 includes a vacuum transducer or vacuum gauge 48 for monitoring the total vacuum pressure therein. The vacuum gauge 48 can provide the total vacuum pressure within CVD process chamber 36 as a feedback to the mass flow controller 46 via a transmission line 49 to provide closed loop control.

The CVD process module 16 further includes a vacuum pump 50, such as a turbomolecular pump, connected via a vacuum line 51 to an exhaust port 52 extending through the chamber wall 38 of the CVD process chamber 36. Provided in the vacuum line 51 is a pumping valve 54 that is operable to selectively isolate the CVD process chamber 36 from the vacuum pump 50 and which may be used to throttle the pumping speed of the vacuum pump 50. The vacuum pump 50 is operable to evacuate the CVD process chamber 36 to a base vacuum pressure of about 1 mTorr. The CVD process chamber 36 is also equipped with a high vacuum pump 56, such as a cryopump, to permit evacuation to a lower base vacuum pressure, such as about 0.001 mTorr, and a pumping valve 57 that is operable to selectively isolate a pumping port 58 of the CVD process chamber 36 from the high vacuum pump 56.

The CVD process module 16 is equipped with additional components as understood by those of ordinary skill in the art for depositing a layer of a material by a chemical vapor deposition process onto an exposed surface of wafer 34. In one conventional design, the CVD process module 16 generally includes a gas-dispersing showerhead 60, a heated wafer support or susceptor 61 for supporting a wafer 34 in a processing location in the vacuum environment 39, and a process gas source/controller 62. The susceptor 61 is operable to heat the wafer 34 to a suitable process temperature. The process gas source/controller 62 provides a regulated flow of reactant gases via a valved process gas line 64 to the gas-dispersing showerhead 60, which provides a distributed flow of the reactant gas mixture into the vacuum environment 39 and over an exposed surface of the heated wafer 34. Under typical CVD operating conditions, the reactant gases are provided at respective flow rates of about 1 sccm to about 5000 sccm to establish a vacuum pressure in the range of about 200 mTorr to about 10 Torr and the wafer 34 is heated to a process temperature between about 200° C. and about 800° C.

The reactant gas mixture chemically reacts on the exposed surface of wafer 34 to deposit a layer of material. For example, a tantalum-based material tantalum nitride (TaN) can be deposited in the CVD process module 16 by passing a regulated flow of a reactant gas mixture containing a tantalum-containing precursor, such as tantalum pentalchloride or tantalum hexafluoride, and a molar excess of a nitrogen-containing reducing agent, such as ammonia, over an exposed surface of the heated wafer 34. The chemical reactions that operate to deposit the layer of material also release reaction byproduct gases that comprise various fluorine-containing species, such as hydrogen fluoride. A large fraction, but not all, of the reaction byproduct gases are evacuated from the CVD process chamber 36 by vacuum pump 50.

With continued reference to FIGS. 1 and 2, the PVD process module 20 includes a chamber wall 66 that encloses a vacuum environment 67 and is illustrated as a sputter deposition system, although the present invention is not so limited. It is appreciated that the PVD process module 20 may be any type of PVD system operative for depositing any PVD-compatible material on wafer 34, including but not limited to the PVD of copper or a copper-based material for use in copper interconnect technologies. Located within the vacuum environment 67 is a wafer support 68, such as a chuck, that supports wafer 34 in a processing position opposite a sputter target 69. The wafer support 68 may be heated, cooled and/or biased as understood by a person of ordinary skill in the art. The vacuum environment 67 inside the chamber wall 66 is adapted to be evacuated by a vacuum pump 70 connected to an inlet 71 in the chamber wall 66 via a valved vacuum line 72. Components of a sputter source 73 operate to generate a plasma within the vacuum environment 67, which is utilized to sputter material from the sputter target 69. A portion of the sputtered material deposits on the wafer 34 as a surface layer. Provided in a side wall portion of chamber wall 66 is an access port 74.

Loadlocks 12, 14 permit the independent introduction of cassettes or lots of wafers 34 from the ambient cleanroom environment outside the transfer vacuum chamber 22 into the vacuum environment 25 of the transfer vacuum chamber 22. Wafers 34 from a cassette positioned in one of the loadlocks, for example, loadlock 12, can be processed while the other of the loadlocks, for example, loadlock 14, is used to introduce a cassette of wafers 34 into the transfer vacuum chamber 22. The loadlocks 12, 14 can be cycled between atmospheric pressure and a vacuum level compatible with the transfer vacuum chamber 22 using a respective one of a pair of vacuum pumps 75*a*, 75*b* so that cassettes of wafers 34 can be introduced and removed without significantly degrading the vacuum environment 25 inside the transfer vacuum chamber 22, typically about 1 mTorr, during introduction. A conventional vacuum valving apparatus 76, 77 isolates the interior of a respective one of loadlocks 12, 14 from the vacuum environment 25 of the transfer vacuum chamber 22 except when wafers 34 located for one of the cassettes are being transferred for processing in cluster tool 10.

With continued reference to FIGS. 1 and 2, a purge gas supply 78 of a purge gas is connected in fluid communication via a gas line 79 with a gas inlet 80 provided in the chamber wall 24 of the transfer vacuum chamber 22. The purge gas supplied by the purge gas supply 78 may be an inert gas, such as argon, or a more reactive gas, such as nitrogen, again depending upon the reactivity of the material deposited by the CVD process. Installed in the gas line 79 between the purge gas supply 78 and the gas inlet 80 is a mass flow controller 81 that is operable to regulate the purge flow of the purge gas into the vacuum environment 25. The transfer vacuum chamber 22 has a vacuum transducer or vacuum gauge 82 for monitoring the total vacuum pressure therein. The vacuum gauge 82 can provide the total vacuum pressure as a feedback to the mass flow controller 81 via a transmission line 83 for closed loop control of the total vacuum pressure.

A vacuum pump 84, such as a turbomolecular vacuum pump, is connected via a vacuum line 85 to an exhaust port 86 provided in the chamber wall 24 of the transfer vacuum chamber 22. A pumping valve 87 is provided in the vacuum line 85 and is operable for selectively isolating the transfer vacuum chamber 22 from the vacuum pump 84. The vacuum pump 84 has a rated pumping speed that is operable to evacuate the transfer vacuum chamber 22 to a base vacuum pressure of about 1 mTorr.

Vacuum gauges 48 and 82 may each be a capacitance manometer having an operating range of about 5 mTorr to about 1 Torr, such as a Type 621 capacitance manometer manufactured and sold by MKS Instruments (Andover, Mass.). An exemplary mass flow controller for use as mass flow controllers 46 and 81 is the model number SEC-733 digital-controlled mass flow controller manufactured and sold by Horiba STEC, Inc. (Great Britain). Exemplary turbomolecular pumps for use as at least vacuum pumps 50 and 84 are manufactured and sold under the MAG-1600 and MAG-2000 model lines by Leybold Vacuum Products Inc. (Export, Pa.). Exemplary cryopumps suitable for use as high vacuum pump 56 are manufactured and sold under the CTI-Cryogenics® CRYO-TORR® model line by Helix Technology Corporation (Mansfield, Mass.).

With continued reference to FIGS. 1 and 2, the chamber wall 24 of the transfer vacuum chamber 22 has a port 88 connected for fluid communication via a vacuum line 89 with a differentially-pumped residual gas analyzer 90, such as a quadrupole mass spectrometer. The residual gas analyzer 90 is operable to identify the concentrations or residual partial pressures of various gas species present in the vacuum environment 25 of vacuum chamber 22. The residual gas analyzer 90 withdraws samples of the residual gases within the vacuum environment 25 of the transfer vacuum chamber 22. The residual gas analyzer 90 measures the partial pressures of particular residual gases in the vacuum environment 25 and, in particular, is applicable for measuring amounts of low-pressure residual gases in vacuum environment 25, such as CVD reaction byproduct gases. In operation, the residual gas analyzer 90 ionizes samples of the residual gases, separates the resulting mixture of ions according to their mass-to-charge ratios, and provides an output signal that is a measure of the relative species present. The output of the residual gas analyzer 90 comprises a mass spectrum representing the peak signal intensity of the ionized gas species collected as a function of the mass-to-charge ratio of the gas species comprising the peak. A plurality of peak intensities can be multiplexed, as known in the art of vacuum technology, to indicate multiple peak intensities as a function of measurement time. A suitable mass range for monitoring CVD reaction byproduct gases is, at least, from 1 to 100 atomic mass units (amu).

Residual gas analyzers, such as residual gas analyzer 90, are familiar devices used in vacuum technology for the detection of gas species and their concentrations in a vacuum chamber. An exemplary residual gas analyzer suitable for use in a process chamber environment, such as in the transfer vacuum chamber 22, is a Vision 1000-P Process RGA System manufactured and sold by MKS Instruments (Andover, Mass.).

Figure 3:
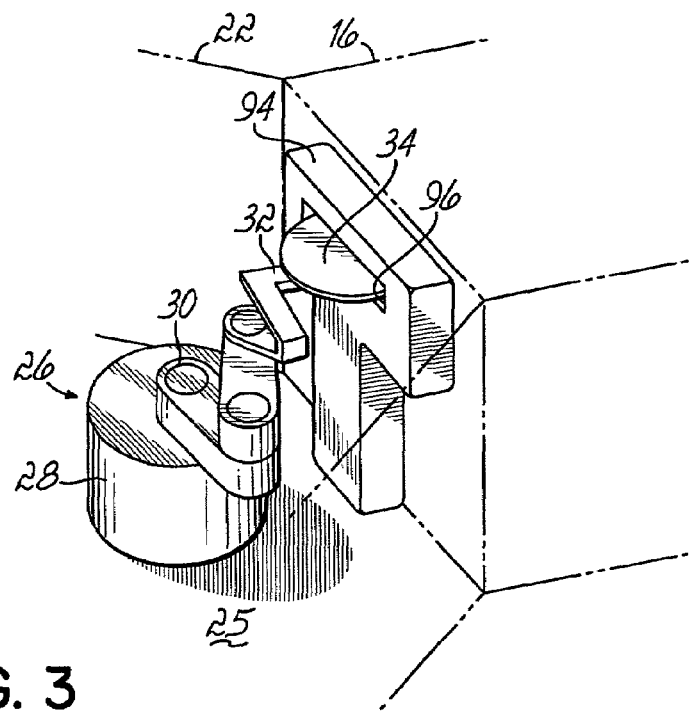
FIG. 3 is a portion of the processing system of FIG. 1 illustrating the transfer of the wafer through the slot valve from the transfer vacuum chamber into the CVD process chamber.

With continued reference to FIGS. 1, 2 and 3, a side wall portion of the chamber wall 24 of transfer vacuum chamber 22 includes an access port 92 that permits wafers 34 to be transferred into and from the CVD process module 16. A slot valve 94, which is typically pneumatically-actuated, is interposed between the access port 40 of the CVD process chamber 36 and the access port 92 of the transfer vacuum chamber 22. The slot valve 94 has a rectangular sealable opening 96 dimensioned to pass the wafer 34 and the end effector 32 holding the wafer 34 and a gate 98 that is movable to sealingly engage the opening 96 in a substantially vacuum-tight fashion. For example, to permit the passage of a typical end effector holding a 300 mm wafer, suitable dimensions for the sealable opening 96 of the slot valve 94 are a width of about 325 mm and a height of about 300 mm. The slot valve 94 has an open condition, illustrated in FIGS. 1, 2 and 3, in which the gate 98 is withdrawn from the opening 96 and the wafer 34 and the end effector 32, holding the wafer 34 with a horizontal orientation, can pass through the sealable opening 96. The slot valve 94 also has a closed condition, in which the gate 98 is extended to provide a sealing engagement with the sealable opening 96, that isolates the vacuum environment 25 of the transfer vacuum chamber 22 from the vacuum environment 39 of the CVD process chamber 36. Exemplary slot valves are the Series 02 and the Series 03 slot valves manufactured and sold by VAT Vacuum Valves AG (Haag, Switzerland). It is understood by those of ordinary skill in the art of vacuum technology that the slot valve 94 may be actuated by a motive force other than pneumatic power. It is also understood by those of ordinary skill in the art of vacuum technology that the CVD process chamber 36 and the transfer vacuum chamber 22 may be interconnected by a conventional gate valve that is not of a slot valve configuration, without departing from the spirit and scope of the present invention.

Other side wall portions of the chamber wall 24 of transfer vacuum chamber 22 include an access port 100 that permits wafers 34 to be transferred into and from the process module 18 and an access port 102 with a sealable opening 103 that permits wafers 34 to be transferred into and from the PVD process module 20. Slot valves 104 and 106, similar to slot valve 94, are also provided for selectively isolating the vacuum environment of process module 18 and the vacuum environment 67 of the PVD process module 20, respectively, from the vacuum environment 25 of the transfer vacuum chamber 22.

With continued reference to FIGS. 1, 2 and 3, the mass flow controller 46 is operable to regulate the flow rate of the purge gas into the CVD process chamber 36. Specifically, mass flow controller 46 regulates the flow rate of purge gas into the CVD process chamber 36 in preparation for opening the slot valve 94 and when the slot valve 94 is in an open condition, such as during a wafer exchange. Similarly, mass flow controller 81 is operable to regulate the flow rate of the purge gas into the transfer vacuum chamber 22 and, specifically, to regulate the flow rate of purge gas into the transfer vacuum chamber 22 in preparation for opening the slot valve 94 and when the slot valve 94 is in an open condition, such as during a wafer exchange. The mass flow controllers 46, 81 are each operable to provide a flow rate of, for example, up to about 500 standard cubic centimeters per minute (sccm) of purge gas. The mass flow controllers 46, 81 are calibrated according to the identity of the purge gas used to provide the purge flow. The choice of purge gas will depend upon the reactivity of the material deposited on the wafer 34 with a particular purge gas. For example, nitrogen gas can be utilized as the purge gas if the material deposited by the CVD process on the wafer 34 is inert to reaction with nitrogen.

If the slot valve 94 between the vacuum transfer chamber 22 and the CVD process module 16 is opened without taking suitable precautions, reaction byproduct gases, including residual reactant gases, migrate out of the vacuum environment 39 of the CVD process chamber 36 and contaminate the vacuum environment 25 of the transfer vacuum chamber 22. Subsequently, when a wafer 34 is transferred from the transfer vacuum chamber 22 to other process modules 18, 20 and, in particular, the process chamber of the PVD process module 20, reaction byproduct gases can pass through the sealable opening 103 in the slot valve 106 and contaminate the PVD process chamber 20. According to the present invention, a directional flow of a pure gas is provided from the transfer vacuum chamber 22 into the CVD process chamber 36 that eliminates, significantly reduces, or otherwise inhibits any migration of CVD reaction byproduct gases out of the CVD process chamber 36 into the transfer vacuum chamber 22 when the sealable opening 96 in slot valve 94 is in an open condition, such as during wafer exchanges.

Figure 4:
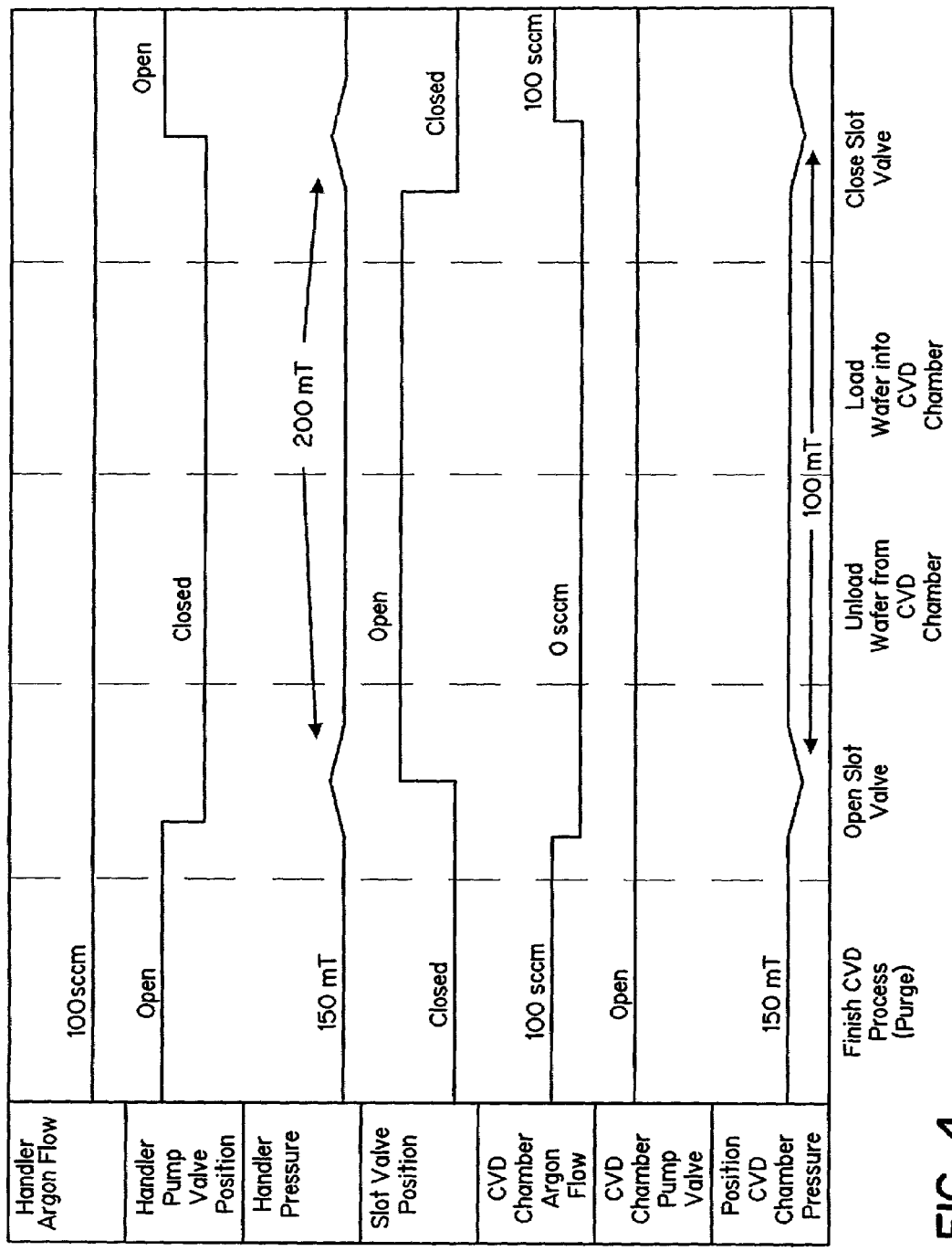
FIG. 4 is a graphical representation of a valving and pumping sequence according to principles of the present invention during a wafer exchange between the transfer vacuum chamber and the CVD process chamber of FIG. 1.

With reference to FIG. 4 and according to the directional purge flow method of the present invention, an event sequence for providing the directional purge flow of a purge gas during a wafer exchange between the CVD process chamber 36 and the transfer vacuum chamber 22 is shown schematically. Specifically, a directional flow of purge gas is established that is directed through the sealable opening 96 of the slot valve 94 from the transfer vacuum chamber 22 into the CVD process chamber 36. To that end, after a CVD process is concluded in the CVD process chamber 36, the regulated flow of the reactant gas mixture is discontinued from process gas source/controller 62 to the CVD process chamber 36 and the processed wafer 34 is cooled. The CVD process chamber 36 is evacuated by vacuum pump 50 to a vacuum pressure near the base vacuum level of at least about 1 mTorr and a purge gas, such as argon, is introduced into the CVD process chamber 36 via gas line 43 from purge gas supply 44 at a predetermined flow rate of, for example, 100 sccm, regulated by mass flow controller 46. The vacuum pressure in the CVD process chamber 36 rises to, for example, about 150 mTorr. Simultaneously, a flow of a purge gas, such as argon, is introduced into the transfer vacuum chamber 22 from purge gas supply 78 via gas line 79 at a predetermined flow rate of, for example, 100 sccm, regulated by mass flow controller 81. The vacuum pressure in the transfer vacuum chamber 22 rises from the base vacuum level of about 1 mTorr to, for example, about 150 mTorr. At this point in the sequence, the vacuum pressures in the transfer vacuum chamber 22 and the CVD process chamber 36 are approximately equivalent to within about 10% and, hereinafter, the common vacuum pressure in chambers 22, 36 will be referred to as a reference vacuum pressure.

After the respective flows of purge gas to the transfer vacuum chamber 22 and the CVD process chamber 36 are stabilized, the pumping valve 87 for the transfer vacuum chamber 22 is closed to isolate the vacuum pump 84 and the flow of purge gas to the CVD process chamber 36 is discontinued. As a result, the vacuum pressure in the transfer vacuum chamber 22 begins to rise and the vacuum pressure in the CVD process chamber 36 begins to drop. When the vacuum pressure in the transfer vacuum chamber 22 reaches about 200 mTorr, for example, and the vacuum pressure in the CVD process chamber 36 reaches about 100 mTorr, for example, the slot valve 94 is actuated to the open condition. Because the vacuum pressure in the CVD process chamber 36 is less than the vacuum pressure in the transfer vacuum chamber 22, a net positive flow of purge gas is established through the sealable opening 96 in the slot valve 94 directed from the transfer vacuum chamber 22 into the CVD process chamber 36. The positive flow of purge gas inhibits the migration of CVD reaction byproduct gases outwardly from the vacuum environment 39 toward the vacuum environment 25.

Because the vacuum pressure differential is minimized by introducing roughly equivalent vacuum pressures of purge gas into the CVD process chamber 36 and into the transfer vacuum chamber 22 before opening the slot valve 94, there is no burst of relatively high pressure gas directed from the transfer vacuum chamber 22 into the CVD process chamber 36 when the slot valve 94 is opened. If not otherwise inhibited by this aspect of the present invention, such a high-pressure burst would create an unstable vacuum condition with flow currents that would transfer CVD reaction byproduct gases from the CVD process chamber 36 into the transfer vacuum chamber 22. Limiting the pressure differential between the CVD process chamber 36 and the transfer vacuum chamber 22 to within about 25% to about 200% is effective to prevent the initial high-pressure burst when the slot valve 94 is opened. For example, if the vacuum pressure in the CVD process chamber 36 is 100 mTorr immediately before opening the slot valve 94, the vacuum pressure in the transfer vacuum chamber 22 should be greater than about 125 mTorr and less than about 200 mTorr for mitigating the migration of reaction by-product gases. The vacuum pressures of the CVD process chamber 36 and the transfer vacuum chamber 22 are monitored with the vacuum gauges 48 and 82, respectively, to determine when the relative pressure differential is suitable for opening the slot valve 94.

With continued reference to FIG. 4, the directional purge flow is maintained while the slot valve 94 is in the open condition. Specifically, the purge flow to the transfer vacuum chamber 22 is maintained at about 100 sccm, the pumping valve 87 for the transfer vacuum chamber 22 remains closed to isolate vacuum pump 84 from the vacuum environment 25 of the transfer vacuum chamber 22, and the pumping valve 54 between the CVD process chamber 36 and the vacuum pump 50 remains open. As a result, purge gas flows from the purge gas supply 78 through mass flow controller 81 into the transfer vacuum chamber 22, through the slot valve 94, through the CVD process chamber 36 toward exhaust port 52, and is evacuated from the CVD process chamber 36 by the vacuum pump 50. The directional flow of purge gas preferentially transports any CVD reaction byproduct gases, arising from the CVD processes transpiring in the CVD process chamber 36 prior to the wafer exchange, toward the exhaust port 52 of the CVD process chamber 36. As a result, the migration of reaction byproduct gases through the sealable opening 96 in the slot valve 94 from the CVD process chamber 36 to the transfer vacuum chamber 22 is significantly reduced, eliminated or inhibited while the slot valve 94 is maintained in the open condition. The vacuum pressures in the CVD process chamber 36 and in the transfer vacuum chamber 22, now interconnected for fluid communication through the sealable opening 96 in the slot valve 94, equilibrate at about 150 mTorr. The end effector 32 of wafer handler 26 is extended through the sealable opening 96 in the slot valve 94 and is used to extract a processed wafer 34 from the CVD process chamber 36 in a pick-and-place operation. The wafer handler 26 transfers the processed wafer 34 to a processing position in another process module 18, 20 or to a support position within one of the wafer cassettes in loadlocks 12, 14. The wafer handler 26 performs a second pick-and-place operation to load a fresh wafer 34 through the sealable opening 96 in the slot valve 94 and to a processing position on the susceptor 61 within the CVD process chamber 36. After the end effector 32 is withdrawn, the slot valve 94 is actuated to the closed condition. The pump valve 87 is reopened to the transfer vacuum chamber 22 and a flow of purge gas is reestablished from purge gas supply 44 to the CVD process chamber 36.

The vacuum pressure in the transfer vacuum chamber 22 for a given flow rate of purge gas will depend upon the chamber volume and the pumping speed of the vacuum pump 84 evacuating the vacuum environment 25 of the transfer vacuum chamber 22. Similarly, the vacuum pressure in the CVD process chamber 36 for a given flow rate of purge gas will depend upon the chamber volume and the pumping speed of the vacuum pump 50 evacuating the vacuum environment 39 of the CVD process chamber 36. Therefore, the relationship between the flow rates of purge gas and the chamber vacuum pressure described above is not intended to be limiting and will be empirically determined for a given CVD process module 16 and a given transfer vacuum chamber 22.

The following examples and comparative examples illustrate the reduction in the transfer of CVD byproduct gases from the CVD process chamber to the wafer transfer chamber provided by performing a wafer transfer according to the principles of the present invention.

COMPARATIVE EXAMPLE 1

A simulated wafer transfer was performed between the CVD process chamber 36 and the transfer vacuum chamber 22 according to a prior art method. The vacuum environment 39 of the CVD process chamber 36 was evacuated and a static partial pressure of about 100 mTorr of a surrogate CVD reaction byproduct gas, fluorine-containing ligand hexafluoroacetylacetonate (hfac), was introduced. Thereafter, the vacuum environment 39 of the CVD process chamber 36 was pumped to a base vacuum pressure of approximately 1 mTorr. The amount of hfac present in the vacuum environment 25 of the transfer vacuum chamber 22 was monitored using the residual gas analyzer 90. Specifically, the peak intensity of the 69 amu fraction, characteristic of hfac, in a mass spectrum of the residual gases inside the vacuum environment 25 was monitored with the residual gas analyzer 90.

Figure 5:
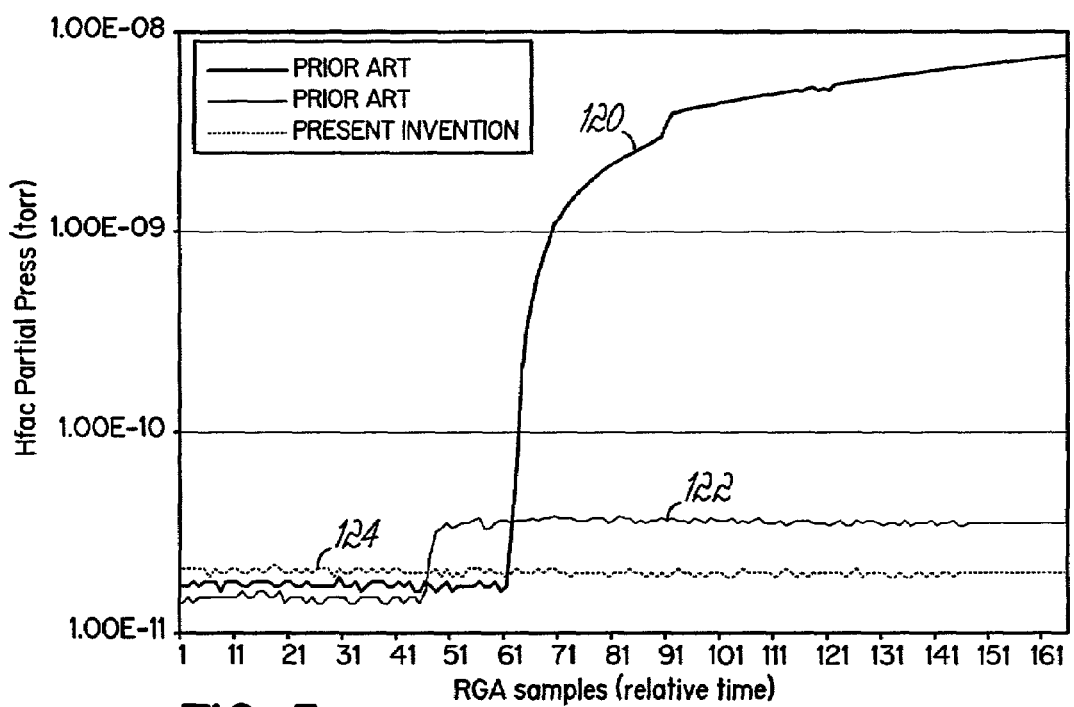
FIG. 5 is a graphical representation of the partial pressure of a surrogate CVD reaction byproduct gas present in the transfer vacuum chamber as a function of time measured by residual gas analysis during a wafer exchange between the transfer vacuum chamber and the CVD process chamber of FIG. 1.

Curve 120 in FIG. 5 graphically depicts the amount of hfac in the transfer vacuum chamber 22 as a function of time during a simulated wafer exchange between the transfer vacuum chamber 22 and the CVD process chamber 36 according to this prior art method. Before the slot valve 94 isolating the CVD process chamber 36 from the transfer vacuum chamber 22 was opened, the peak intensity characteristic of hfac had a relatively low background level. At a time corresponding to about RGA sample number 62, the slot valve 94 was actuated to the open condition to simulate a wafer transfer. Opening the slot valve 94 permitted fluid communication through the sealable opening 96 between the vacuum environment 39 of the CVD process chamber 36 and the vacuum environment 25 of the transfer vacuum chamber 22. It is apparent from Curve 120 that a significant amount of hfac migrated through the opening 96 from the CVD process chamber 36 to the transfer vacuum chamber 22. Specifically, the peak intensity of the 69 amu fraction increased abruptly by over two orders of magnitude shortly after the slot valve 94 was actuated to the open condition. While the slot valve 94 was maintained in the open condition through RGA sample number 165, hfac continued to migrate into the transfer vacuum chamber 22 as indicated by the rising partial pressure of hfac sensed by the residual gas analyzer 90. Therefore, in the absence of special precautions and under one typical prior art wafer exchange condition, significant migration or back-diffusion of hfac occurred from the CVD process chamber 36 to the transfer vacuum chamber 22. It is apparent from Curve 120 that merely evacuating the CVD process chamber 36 to a base vacuum level did not remove all of the residual hfac from chamber 36. It is also apparent that the residual hfac was prone to migration when the slot valve 94 was opened and acted as a significant source of contamination in the transfer vacuum chamber 22.

COMPARATIVE EXAMPLE 2

A simulated wafer transfer was performed between the CVD process chamber 36 and the transfer vacuum chamber 22 according to another prior art method. The vacuum environment 39 of the CVD process chamber 36 was evacuated and an amount of hfac was introduced to establish a static partial pressure of about 100 mTorr. Thereafter, the vacuum environment 39 of the CVD process chamber 36 was pumped to a base vacuum pressure of approximately 0.001 mTorr. The amount of hfac present in the vacuum environment 25 of the transfer vacuum chamber 22 was monitored using the residual gas analyzer 90. Specifically, the peak intensity of the 69 amu fraction, characteristic of hfac, in a mass spectrum of the residual gases inside the vacuum environment 25 was monitored with the residual gas analyzer 90.

Curve 122 in FIG. 5 graphically depicts the amount of hfac in the transfer vacuum chamber 22 as a function of time during a simulated wafer exchange between the transfer vacuum chamber 22 and the CVD process chamber 36 according to this prior art method. Before the slot valve 94 isolating the CVD process chamber 36 from the transfer vacuum chamber 22 was opened, the peak intensity characteristic of hfac had a relatively low background level. At a time roughly corresponding to RGA sample number 45, the slot valve 94 was actuated to the open condition to simulate a wafer transfer by permitting fluid communication through the sealable opening 96 between the vacuum. The opening of the slot valve 94 caused the migration of a significant amount of hfac from the CVD process chamber 36 to the transfer vacuum chamber 22. Specifically, the peak intensity characteristic of hfac increased abruptly by about a factor of three shortly after the slot valve 94 was actuated to the open condition. Although the residual partial pressure of hfac is lower than in Comparative Example 1, a significant amount of hfac diffuses through the sealable opening 96 in the slot valve 94 and is detected in the transfer vacuum chamber 22 after opening the slot valve 94. While the slot valve 94 was maintained in the open condition up through RGA sample number 165, hfac continues to migrate into the transfer vacuum chamber 22 as indicated by the constant partial pressure of hfac sensed by the residual gas analyzer 90. It is apparent lowering the base by three orders of magnitude reduced, but did not eliminate, the residual hfac partial pressure in the CVD process chamber 36 as compared with Comparative Example 1.

EXAMPLE 1

A simulated wafer transfer was performed between the CVD process chamber 36 and the transfer vacuum chamber 22 according to the principles of the present invention. Specifically, the directional purge flow method of the present invention, as described above in relation to FIG. 4, was employed to minimize the pressure differential between the vacuum environment 39 of the CVD process chamber 36 and the vacuum environment 25 of the transfer vacuum chamber 22. The vacuum environment 39 of the CVD process chamber 36 was evacuated and an amount of hfac was introduced to establish a static partial pressure of about 100 mTorr. Thereafter, vacuum environment 39 was evacuated to a base vacuum pressure of approximately 1 mTorr.

According the principles of the present invention, before opening the slot valve 94, mass flow controller 81 was used to introduce purge gas (argon) from the purge gas supply 78 sufficient to establish a reference vacuum pressure of about 500 mTorr in the transfer vacuum chamber 22. Similarly, mass flow controller 46 was used to introduce purge gas (argon) from the purge gas supply 44 sufficient to establish a reference vacuum pressure of about 500 mTorr in the CVD process chamber 36. The amount of hfac present in the vacuum environment 25 of the transfer vacuum chamber 22 was monitored using the residual gas analyzer 90. Specifically, the peak intensity of the 69 amu fraction, characteristic of hfac, in a mass spectrum of the residual gases inside the vacuum environment 25 was monitored with the residual gas analyzer 90.

Before opening the slot valve 94, the pumping valve 87 for the transfer vacuum chamber 22 was closed to isolate vacuum pump 84 from the vacuum environment 25 of the transfer vacuum chamber 22 and the flow of purge gas to the vacuum environment of the vacuum environment 39 of the CVD process chamber 36 was discontinued. When the slot valve 94 was opened near RGA sample 50, it is apparent from Curve 124 in FIG. 5 that the partial pressure of hfac in the transfer vacuum chamber 22 did not increase above the established background level. It is also apparent from Curve 124 that the partial pressure of hfac did not increase while the slot valve 94 remained open through RGA sample number 165.

Therefore, the utilization of the directional purge flow method of the present invention significantly reduces, eliminates or inhibits the migration of the hfac through the sealable opening 96 in the slot valve 94 into the transfer vacuum chamber 22 otherwise induced by the establishment of a pathway between the CVD process chamber 36 and the transfer vacuum chamber 22. The directional flow of purge gas also prevents the migration of hfac from the CVD process chamber 36 to the transfer vacuum chamber while slot valve 94 is maintained in the open condition. Based upon the results of this demonstration in contrast to Comparative Examples 1 and 2, it is apparent that the migration of CVD reaction byproduct gases is significantly reduced, eliminated or otherwise inhibited by the direction purge flow method of the present invention.

EXAMPLE 2

Another aspect of the present invention can be demonstrated by residual gas analysis that illustrates the flow of various surrogate gas species from the interior of the CVD process chamber 36 into the transfer vacuum chamber 22 in which a directional purge flow is established with an increasing flow rate. In the following demonstration, a fixed amount of a gas mixture of helium, nitrogen, and krypton was introduced into the CVD process chamber 36. With the slot valve 94 maintained in an open condition to simulate conditions during a wafer exchange, the peak intensities characteristic of krypton (84 amu), nitrogen (28 amu) and helium (4 amu) were monitored while the flow rate of the purge flow of argon (40 amu) was incremented from about 50 sccm to about 500 sccm. Krypton, nitrogen and helium are surrogate CVD reaction byproduct gases selected to span a wide range of molecular weights characteristic of the reaction byproduct gases released in a typical CVD process and which are candidates for migration into the adjacent transfer vacuum chamber 22. These surrogate CVD reaction byproduct gases are believed to have flow and diffusion characteristics in the respective vacuum environments 25, 39 of the transfer vacuum chamber 22 and the CVD process chamber 36 similar to the flow and diffusion characteristics of the actual reaction byproduct gases of similar molecular weights produced by a CVD process.

Figure 6:
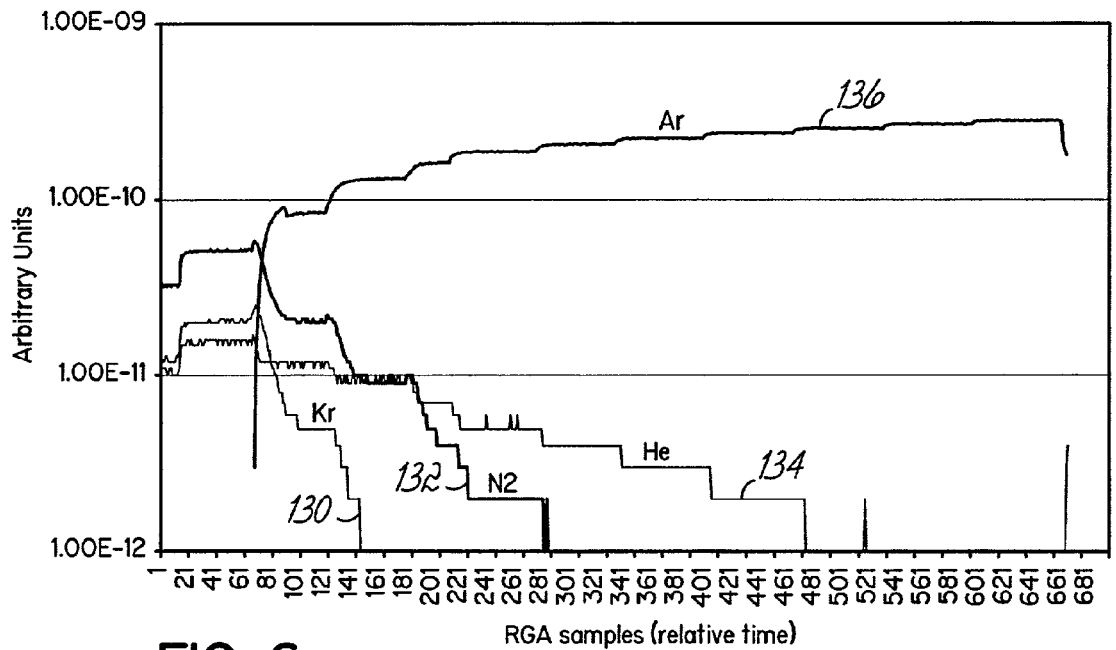
FIG. 6 is a graphical representation of the peak intensities of surrogate CVD reaction byproduct gases present in the transfer vacuum chamber as a function of time measured by residual gas analysis during a wafer exchange according to the principles of the present invention between the CVD process chamber and the transfer vacuum chamber of FIG. 1.

With reference to FIG. 6, the peak intensities of the surrogate CVD reaction byproduct gases in the transfer vacuum chamber 22 are displayed in a semi-logarithmic plot as a function of time during a wafer exchange between the CVD process chamber 36 and the transfer vacuum chamber 22 according to principles of the present invention. The baseline levels of the peak intensities characteristic of krypton, nitrogen and helium, before the purge flow of argon is initiated, are indicated in Curves 130, 132 and 134 between RGA sample numbers 10 and 60. After establishing the baseline levels, a purge flow of argon was initiated, as indicated in Curve 136 at about RGA sample number 70. The rate of the purge flow of argon was increased in 50 sccm increments from about 50 sccm to about 500 sccm, as indicated by the steps visible in Curve 136. The successive increases in the purge flow of argon are manifested in Curve 136 as a series of steps with increasing sample number in the 40 amu mass fraction.

Curve 130 shows that the peak intensity for krypton, the surrogate CVD reaction byproduct gas having the greatest molecular weight, reaching the transfer vacuum chamber 22 from the CVD process chamber 36 decreases dramatically for an argon purge flow rate of about 50 sccm. When the purge flow rate of argon is increased to about 100 sccm, the krypton level in the transfer vacuum chamber 22 drops to below the detection limit of the residual gas analyzer 90. Curve 132 shows that the peak intensity for nitrogen, which is the surrogate CVD reaction byproduct gas of intermediate molecular weight, decreases successively as the purge flow rate of argon is increased and drops below the detection limit of the residual gas analyzer 90 at a purge flow rate of about 250 sccm. Curve 134 shows that helium, the lightest of the surrogate CVD reaction byproduct gases, requires an argon purge flow rate of about 400 sccm before the level of helium in the transfer vacuum chamber 22 is reduced to below the detection limit of the residual gas analyzer 90. It is apparent from FIG. 6 that the purge flow rate required to suppress back-diffusion or migration of the surrogate CVD reaction byproduct gases varies with the molecular weight of the gas species with heavier surrogate gases requiring a lower flow rate of purge gas to suppress migration. It is also apparent that the flow rate, which is representative of the linear velocity of the purge flow, that is necessary to stop migration of CVD reaction byproduct gases from the CVD process chamber 36 through the sealable opening 96 in the slot valve 94 and into the transfer vacuum chamber 22, is relatively low. In this specific example, a purge flow rate of about 400 sccm suffices to prevent the migration of surrogate CVD reaction byproduct gases having a molecular weight greater than or equal to 4 amu.

EXAMPLE 3

Figure 7:
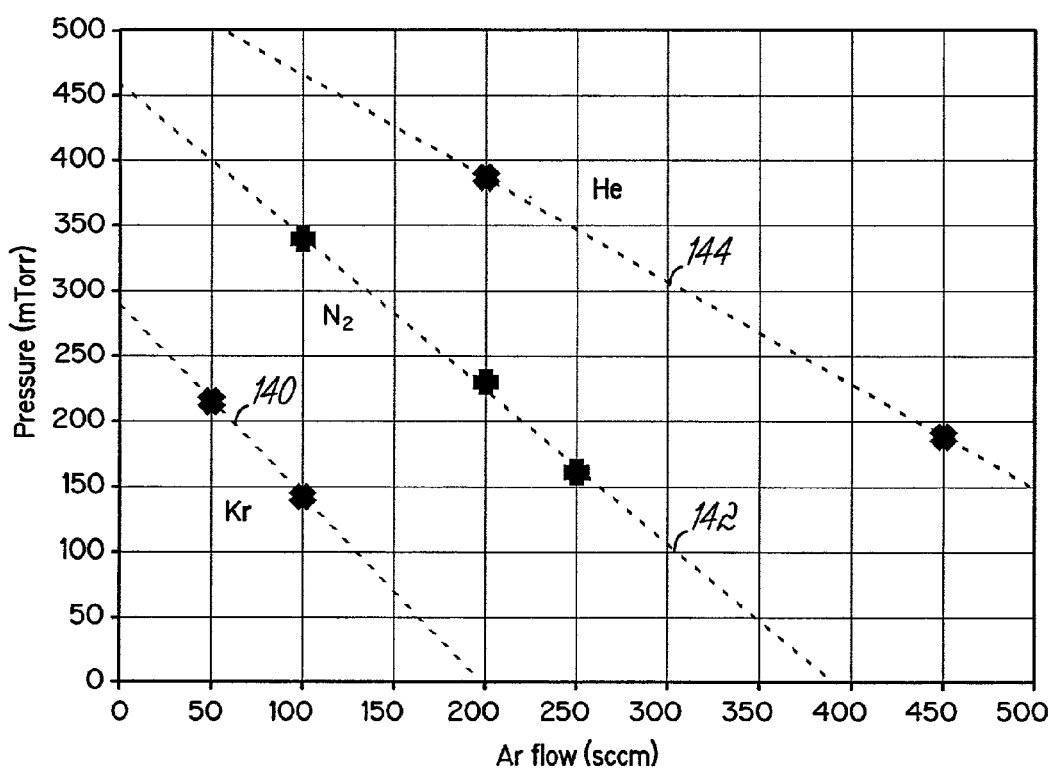
FIG. 7 is a graphical representation of the peak intensities of surrogate CVD reaction byproduct gases as a function of the flow rate of purge gas and the vacuum pressure in the transfer vacuum chamber during a wafer exchange according to the principles of the present invention between the CVD process chamber and the transfer vacuum chamber of FIG. 1.

FIG. 7 is a graphical representation of the relationship between the flow rate of the purge gas and the vacuum pressure in the transfer vacuum chamber 22 that is effective to eliminate the migration of surrogate CVD reaction byproduct gases from the CVD process chamber 36 through the sealable opening 96 in the slot valve 94 and into the transfer vacuum chamber 22. The relationship is shown in FIG. 7 for the surrogate CVD reaction byproduct gases krypton (Curve 140), nitrogen (Curve 142) and helium (Curve 144). To determine the relationship, a fixed amount of a gas mixture of helium, nitrogen, and krypton was introduced into the CVD process chamber 36. With the slot valve 94 maintained in an open condition to simulate conditions during a wafer exchange, the peak intensities characteristic of krypton (84 amu), nitrogen (28 amu) and helium (4 amu) were monitored while the flow rate of the purge flow of argon (40 amu) was incremented in 50 sccm steps from about 50 sccm to about 500 sccm. The reference vacuum pressure in the transfer vacuum chamber 22 was determined, under each of the flow conditions, using a vacuum gauge. The reference vacuum pressure ranged from about 125 mTorr to about 400 mTorr over the range of flow rates for the purge flow into the transfer vacuum chamber 22. In each instance, a flow of purge gas was provided to the CVD process chamber 36 to raise the vacuum pressure in the CVD process chamber 36 to the reference vacuum pressure.

With continued reference to FIG. 7, it is apparent that the ability of the purge gas flow to eliminate the migration of the surrogate CVD reaction byproduct gases depends upon the flow rate of the purge gas into the vacuum transfer chamber 22, the vacuum pressure in the transfer vacuum chamber 22, and the atomic or molecular size of the surrogate CVD reaction byproduct gas atom or molecule. For a given surrogate reaction byproduct gas species, the purge flow rate that is required to suppress migration decreases with increasing vacuum pressure in the transfer vacuum chamber 22. It is also apparent that back-diffusion of molecules with large atomic or molecular sizes is suppressed more easily than the back-diffusion of molecules having smaller atomic or molecular sizes. It is believed that this effect is attributable to the atomic or molecule diameter, or scattering cross section, of the surrogate CVD reaction byproduct gas atom or molecule rather than to the molecular weight thereof. The surrogate CVD reaction byproduct gases are representative of CVD reaction byproduct gases of similar molecular weights.

COMPARATIVE EXAMPLE 3

Figure 8:
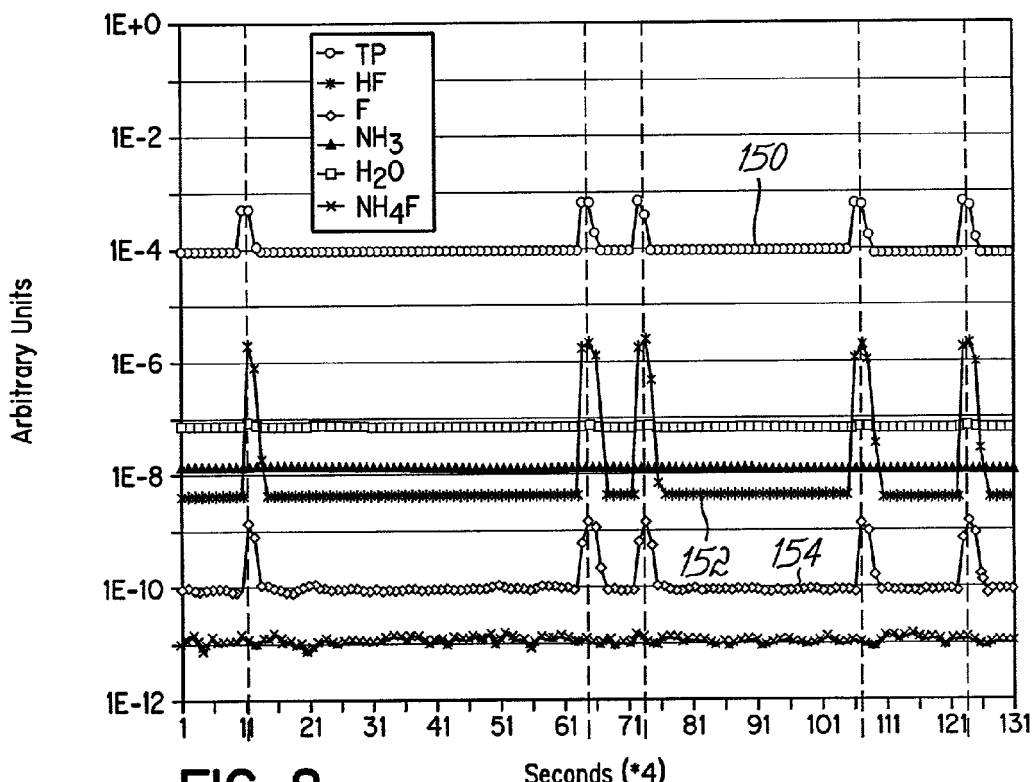
FIG. 8 is a graphical representation of the peak intensities of CVD reaction byproduct gases in the transfer vacuum chamber as a function of time when the slot valve between the transfer vacuum chamber and the CVD process chamber of FIG. 1 is actuated according to a prior art method.

FIG. 8 graphically depicts the peak intensities of CVD reaction byproduct gases in the transfer vacuum chamber 22 as a function of time during a series of simulated wafer transfers between the CVD process chamber 36 and the transfer vacuum chamber 22 according to a prior art method. A wafer 34 was located in the processing position on the susceptor 61 of the CVD process chamber 36 and TaN was deposited onto wafer 34 under the conditions of a typical process recipe. The vacuum environment 39 of the CVD process chamber 36 was then evacuated to a vacuum pressure of about 1 mTorr. Over the time interval shown in FIG. 8, the slot valve 94 was opened and closed five individual times near the dashed vertical lines.

The residual gas analyzer 90 sampled the vacuum environment 25 inside the transfer vacuum chamber 22 over the displayed time interval and the peak intensities of certain gas species of interest were acquired as multiplexed data. Specifically, the residual gas analyzer 90 was used to temporally monitor the peak intensities of fluorine (19 amu), water (18 amu), ammonia (17 amu), ammonium hydrofluoride (37 amu), and tantalum pentafluoride or TP in the mass spectra of the residual gases in the vacuum environment 25 of the transfer vacuum chamber 22.

It is apparent that the residual gas analyzer 90 detected significant increase in the peak intensities of the mass fractions characteristic of the CVD reaction byproduct gases TP (Curve 150), HF (Curve 152), and F (Curve 154) whenever slot valve 94 was open. For example, the peak intensity associated with NH$_4$F increased in Curve 152 by almost three orders of magnitude each time that the slot valve 94 is cycled. Each time that the slot valve 94 was returned to the closed condition, the peak intensities of the mass fractions characteristic of TP, HF, and F returned to their respective background levels, as indicated in Curves 150, 152 and 154, respectively. Therefore, it is apparent that significant amounts of the CVD reaction byproduct gases TP, HF, and F migrated through the sealable opening 96 in the slot valve 94 from the CVD process chamber 36 into the transfer vacuum chamber 22 when the slot valve 94 was placed into the open condition.

EXAMPLE 4

Figure 9:
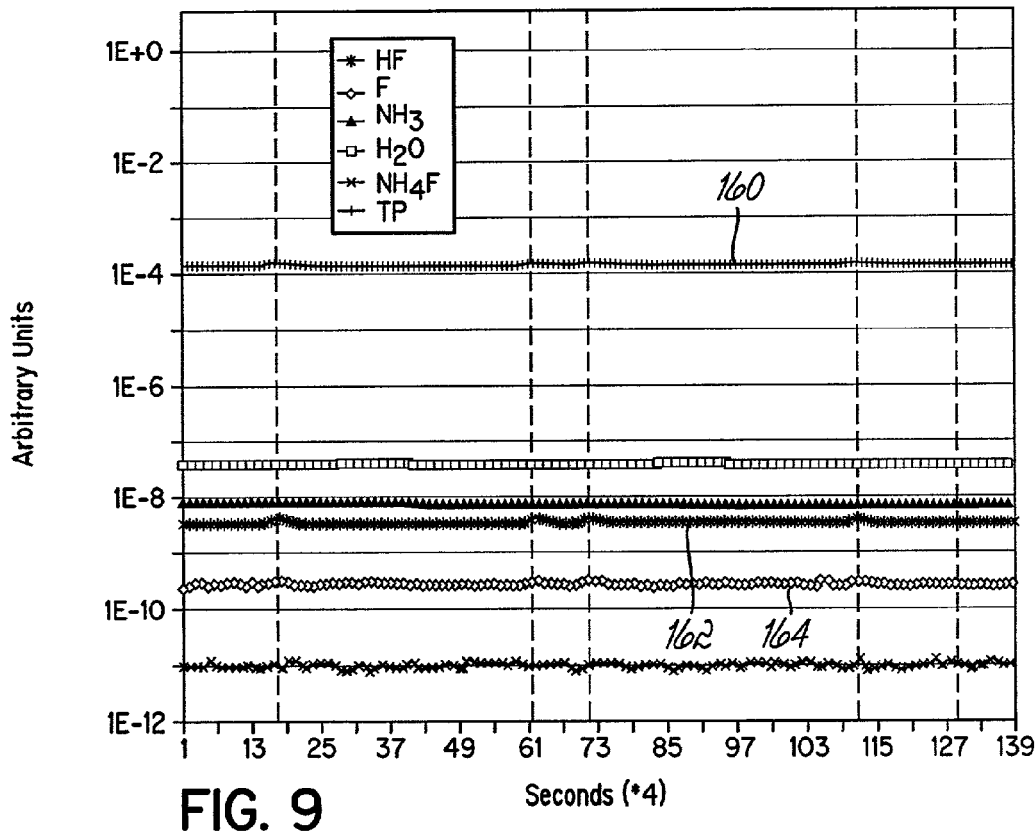
FIG. 9 is a graphical representation of the peak intensities of CVD reaction byproduct gases in the transfer vacuum chamber as a function of time when the slot valve between the transfer vacuum chamber and the CVD process chamber of FIG. 1 is actuated according to the principles of the present invention.

FIG. 9 graphically depicts the peak intensities of CVD reaction byproduct gases in the transfer vacuum chamber 22 as a function of time when the slot valve 94 between the transfer vacuum chamber 22 and the CVD process chamber 36 is actuated according to principles of the present invention. The CVD process chamber 36 was used to deposit TaN on wafer 34 under a typical process recipe and, thereafter, evacuated to a base vacuum of about 1 mTorr. Flows of purge gas were provided to the transfer vacuum chamber 22 and to the CVD process chamber 36 sufficient to raise the respective vacuum pressures to a reference vacuum pressure of about 200 mTorr. The slot valve 94 was actuated on five occasions over the displayed time interval between the closed and open conditions.

The residual gas analyzer 90 sampled the vacuum environment 25 inside the transfer vacuum chamber 22 over the displayed time interval and the peak intensities of certain gas species of interest were acquired as multiplexed data. Specifically, the residual gas analyzer 90 was used to temporally monitor the peak intensities of fluorine (19 amu), water (18 amu), ammonia (17 amu), ammonium hydrofluoride (37 amu), and tantalum pentafluoride or TP in the mass spectra of the residual gases in the vacuum environment 25 of the transfer vacuum chamber 22.

It is apparent that the peak intensities of the mass fractions characteristic of TP (Curve 160), HF (Curve 162), and F (Curve 164) did not change significantly when the slot valve 94 was opened, as compared with the peak intensities in Curves 150, 152 and 154, respectively, of the Comparative Example 3 shown in FIG. 8. Specifically, no significant increase is perceived in the peak intensities in any one of Curves 160, 162 and 164 when the slot valve 94 was opened and closed in any of the five actuations. Therefore, the directional purge flow of the present invention significantly reduces, inhibits or eliminates the migration of CVD reaction byproduct gases through the opening 96 in slot valve 94 from the CVD process chamber 36 into the transfer vacuum chamber 22 as a result of opening and closing the slot valve 94 to establish fluid communication between the CVD process chamber 36 and the transfer vacuum chamber 22.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. For example, the present invention can be used to control the flow of contaminants between any two vacuum environments having a selectively openable interconnection. The invention in its broader aspects is, therefore, not limited to the specific details, representative apparatus and method and illustrative examples shown and described. Accordingly, departures may be made from such details without departing from the scope or spirit of applicants' general inventive concept.

Accordingly, what is claimed is:

1. A method of controlling the migration of reaction by-product gases from a chemical vapor deposition (CVD) process chamber contaminated with CVD reaction by-products to a transfer vacuum chamber through a gate valve interconnecting the chambers, the CVD process chamber selectively evacuated by a first vacuum pump and the transfer vacuum chamber selectively evacuated by a second vacuum pump, the method comprising:

introducing a first flow of a purge gas from a first purge gas supply into the CVD process chamber, with the gate valve closed, sufficient to establish a first vacuum pressure;

introducing a second flow of the purge gas from a second purge gas supply into the transfer vacuum chamber, with the gate valve closed, sufficient to establish a second vacuum pressure;

discontinuing the first flow of the purge gas so that the vacuum pressure in the CVD process chamber falls to a third vacuum pressure less than the first vacuum pressure;

isolating the second vacuum pump from the transfer vacuum chamber, while continuing to introduce the second flow of the purge gas to the transfer vacuum chamber, so that the vacuum pressure in the transfer vacuum chamber rises from the second vacuum pressure to a fourth vacuum pressure greater than the third vacuum pressure; and opening the gate valve to couple the transfer vacuum chamber and the CVD process chamber in fluid communication after performing the steps of discontinuing and isolating, the second flow of the purge gas directed into the CVD process chamber and the pressure differential between the third vacuum pressure and the fourth vacuum pressure being sufficiently low to reduce the migration of reaction by-product gases from the CVD process chamber to the transfer vacuum chamber induced by the opening of the gate valve.

2. The method of claim 1 further comprising:

maintaining the second flow of the purge gas at a predetermined flow rate directed through the open gate valve from the transfer vacuum chamber into the CVD process chamber, the second flow of the purge gas being evacuated from the CVD process chamber along with the reaction byproduct gases by the first vacuum pump so that the migration of reaction byproduct gases through the open gate valve into the transfer vacuum chamber is inhibited while the gate valve is open.

3. The method of claim 2 wherein the first vacuum pressure is substantially equal to the second vacuum pressure.

4. The method of claim 2 wherein, during the step of maintaining, the gate valve is open for a time sufficient to remove a first substrate from a processing position in the CVD process chamber and to position a second substrate at the processing position.

5. The method of claim 2 wherein, during the step of maintaining, the second flow rate of the purge gas is effective to prevent migration of reaction byproduct gases heavier than a given threshold molecular weight through the open gate valve and into the transfer vacuum chamber.

6. The method of claim 1 wherein the pressure differential between the third and fourth vacuum pressures is in the range of about 25% to about 200%.

7. The method of claim 1 further comprising:
   closing the gate valve interconnecting the CVD process chamber with the transfer vacuum chamber; and
   transferring the substrate from the transfer vacuum chamber to a physical vapor deposition process chamber.

8. A method of transferring a substrate among a transfer vacuum chamber, a physical vapor deposition (PVD) process chamber, and a chemical vapor deposition (CVD) process chamber contaminated with CVD reaction by-product gases, the method comprising:
   supplying a flow of a purge gas to the CVD process chamber;
   supplying a flow of the purge gas to the transfer vacuum chamber;
   evacuating the transfer vacuum chamber while supplying the flow of the purge gas to the transfer vacuum chamber;
   establishing a pressure differential, after the purge gas is supplied to the CVD process chamber and the purge gas is supplied to the transfer vacuum chamber, by continuing to flow the purge gas to the transfer vacuum chamber, discontinuing evacuation of the transfer vacuum chamber, discontinuing flow of the purge gas to the CVD process chamber and evacuating the CVD process chamber such that a first vacuum pressure in the CVD process chamber is lower than a second vacuum pressure in the transfer vacuum chamber;
   opening a gate valve between the CVD process chamber and the transfer vacuum chamber after the pressure differential is established;
   maintaining the pressure differential while the gate valve is open;
   transferring a substrate through the open gate valve from the CVD process chamber to the transfer vacuum chamber;
   closing the gate valve between the CVD process chamber and the transfer vacuum chamber; and
   after the gate valve is closed, transferring the substrate from the transfer vacuum chamber to the PVD process chamber.

9. The method of claim 8 further comprising:
   depositing a layer on the substrate in the CVD process chamber before supplying the purge gas to the CVD process chamber and the transfer vacuum chamber.

10. The method of claim 8 further comprising:
    depositing a layer on the substrate in the PVD process chamber.

* * * * *